US012066959B2

(12) United States Patent
Ramachandran et al.

(10) Patent No.: US 12,066,959 B2
(45) Date of Patent: Aug. 20, 2024

(54) PROVISIONING A REFERENCE VOLTAGE BASED ON AN EVALUATION OF A PSEUDO-PRECISION RESISTOR OF AN IC DIE

(71) Applicant: Intel Corporation, Santa Clara, CA (US)

(72) Inventors: Vijayalakshmi Ramachandran, Chandler, AZ (US); Mingming Xu, Phoenix, AZ (US); Dror Lazar, Kiryat Bialik (IL)

(73) Assignee: Intel Corporation, Santa Clara, CA (US)

( * ) Notice: Subject to any disclaimer, the term of this patent is extended or adjusted under 35 U.S.C. 154(b) by 25 days.

(21) Appl. No.: 17/743,297

(22) Filed: May 12, 2022

(65) Prior Publication Data
US 2023/0367725 A1  Nov. 16, 2023

(51) Int. Cl.
  *G06F 13/20* (2006.01)
  *G01R 31/28* (2006.01)
  *G05F 1/46* (2006.01)

(52) U.S. Cl.
  CPC ......... *G06F 13/20* (2013.01); *G01R 31/2889* (2013.01); *G05F 1/46* (2013.01); *G06F 2213/40* (2013.01)

(58) Field of Classification Search
  CPC .................................. G05F 1/46; H03M 1/785
  See application file for complete search history.

(56) References Cited

U.S. PATENT DOCUMENTS

| 5,434,536 | A | * | 7/1995 | Pritchard | ................. | H03G 7/00 327/306 |
| 6,144,218 | A | | 11/2000 | Smith et al. | | |
| 6,507,828 | B1 | * | 1/2003 | Leonard | ................. | G06N 3/063 706/41 |
| 6,563,337 | B2 | | 5/2003 | Dour | | |
| 6,803,790 | B2 | | 10/2004 | Haycock et al. | | |
| 6,842,035 | B2 | | 1/2005 | Kurts et al. | | |
| 9,152,257 | B2 | | 10/2015 | McCall et al. | | |
| 2006/0066346 | A1 | | 3/2006 | Lim et al. | | |
| 2012/0120712 | A1 | * | 5/2012 | Kawai | ................. | G11C 13/0007 257/E21.645 |
| 2014/0204623 | A1 | * | 7/2014 | Djenguerian | ..... | H02M 3/33523 363/21.12 |

(Continued)

*Primary Examiner* — Getente A Yimer
(74) *Attorney, Agent, or Firm* — Essential Patents Group, LLP

(57) ABSTRACT

Techniques and mechanisms for determining a reference voltage which is to be provided with an integrated circuit (IC) die. In an embodiment, the IC die comprises a resistor, and a hardware interface which accommodates coupling of the IC die to a test unit. The test unit provides functionality to perform an evaluation of a resistance of the resistor, wherein said resistance is indicative of the respective resistances of one or more other resistors of the IC die. Based on the evaluation, the test unit provides to the IC die an indication of a scale factor, wherein the reference voltage is generated based on the scale factor. In another embodiment, the IC die further comprises an amplifier circuit which receives the reference voltage, wherein a variable resistance circuit of the IC die is configured based on an output of the amplifier circuit.

17 Claims, 7 Drawing Sheets

(56) References Cited

U.S. PATENT DOCUMENTS

| | | | |
|---|---|---|---|
| 2014/0347119 A1* | 11/2014 | Vacca Cavalotto | ................... G01R 19/0092 327/434 |
| 2016/0070277 A1* | 3/2016 | Price | ................... G05F 1/46 324/123 R |
| 2017/0045557 A1* | 2/2017 | Kawa | ................... G06F 30/367 |
| 2017/0126244 A1* | 5/2017 | Nandi | ................... H03M 1/785 |
| 2021/0134334 A1 | 5/2021 | Pilolli et al. | |

* cited by examiner

PROVISIONING A REFERENCE VOLTAGE BASED ON AN EVALUATION OF A PSEUDO-PRECISION RESISTOR OF AN IC DIE

BACKGROUND

1. Technical Field

This disclosure generally relates to the field of integrated circuits and more particularly, but not exclusively, to tuning of integrated circuit input/output circuitry.

2. Background Art

Changes in input/output (I/O) timing parameters can severely impact I/O performance, particularly with respect to high performance or high frequency I/O design. Typically, I/O circuitry is designed for operation within strict timing guidelines. Failure to operate with the intended timing parameters may prevent such I/O circuitry from operating properly. Alternatively, failure to operate within these timing parameters may prevent I/O circuitry from interfacing properly with other circuitry that does adhere to the timing parameters.

Process variations introduced during the manufacture of I/O circuitry can cause variations that detract from optimal performance even if the I/O circuitry is still operating within intended timing parameters. In some instances, process variations prevent I/O circuitry from functioning or prevent the I/O circuitry from performing in accordance with the intended timing parameters. Lack of adequate compensation for individual I/O components can result in departure from optimal performance if, for example, the timing parameters change.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
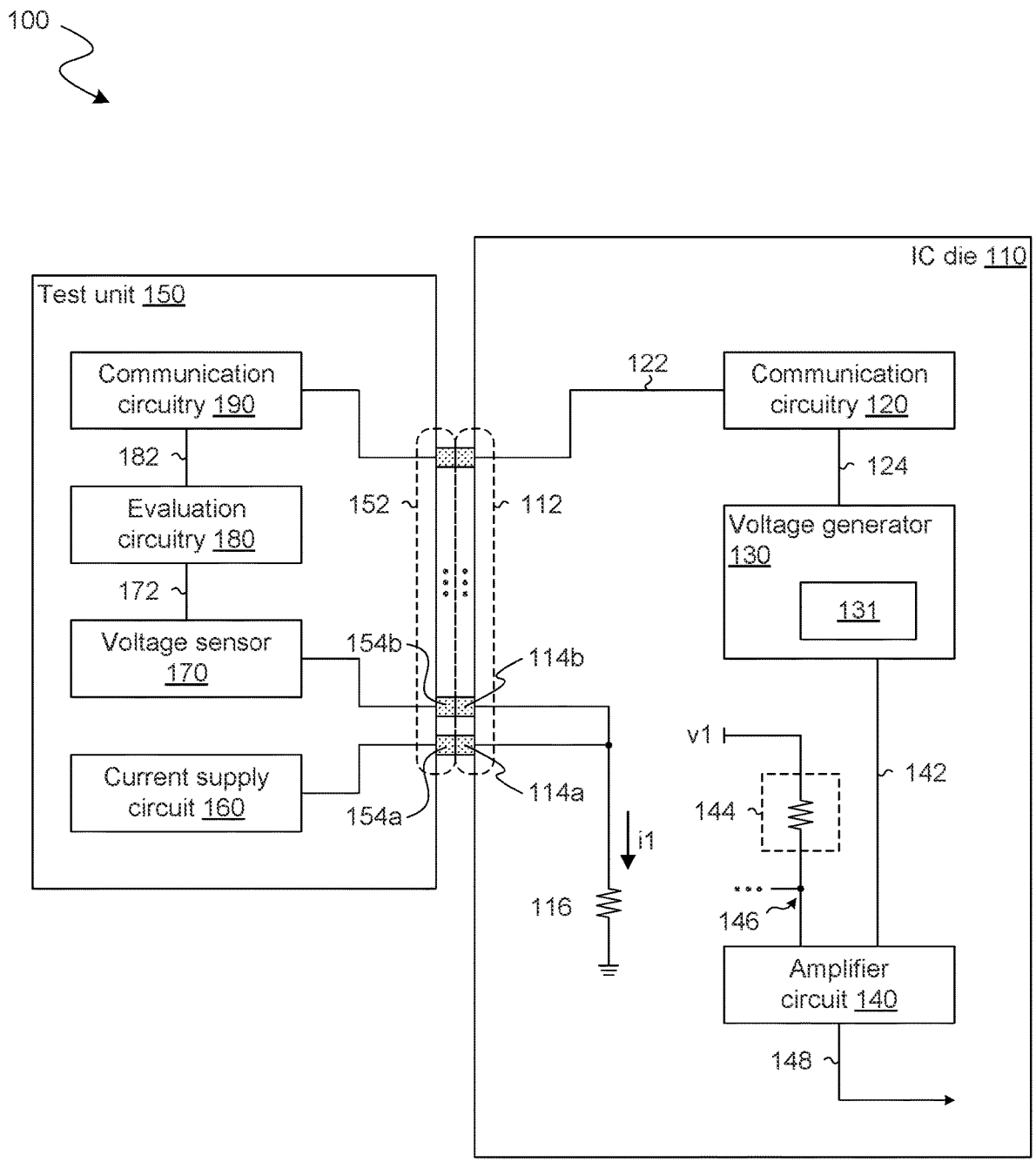
FIG. 1 shows a functional block diagram illustrating features of a system to determine a reference voltage to be provided with an IC die according to an embodiment.

Embodiments discussed herein variously provide techniques and mechanisms for determining a level of a reference voltage which is to be provided with an integrated circuit (IC) die. Such determining is based on the resistance of one resistor of the IC die, wherein said resistance is the same as, or otherwise corresponds to, the respective resistances of one or more other resistors of the IC die.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third." etc., to describe a common object, merely indicate that different instances of like objects are being referred to and are not intended to imply that the objects so described must be in a given sequence, either temporally, spatially, in ranking or in any other manner.

The terms "left," "right." "front." "back." "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry to facilitate the evaluation of a test resistor of an IC die.

FIG. 1 shows features of a system 100 to determine a reference voltage to be provided with an IC die according to an embodiment. System 100 illustrates one example of an embodiment which provides functionality to use a resistor of an IC die as a basis for estimating or otherwise determining the respective resistances of one or more other resistors of the same IC die.

As shown in FIG. 1, system 100 comprises an IC die 110, and a test unit 150 coupled thereto. IC die 110 comprises a hardware interface 112 by which IC die 110 is to couple to a hardware interface 152 of test unit 150. For example, hardware interface 152 comprises conductive contacts—e.g., comprising metal bumps, pads, pins, balls, leads and/or other suitable conductors—which are to variously couple each to a respective conductive contact of hardware interface 112. Other embodiments are variously implemented solely with some or all of IC die 110, or are implemented solely with some or all of test unit 150.

IC die 110 comprises any of various types of integrated circuitry which, for example, provides functionality of a general-purpose processor, a graphics processor, a memory, and/or the like. In some embodiments, IC die 110 is a system on chip (SoC). However, various embodiments are not limited with respect to any particular functionality which IC die 110 might be provide in addition to that described herein.

Test unit 150 provides functionality to evaluate one or more performance characteristics of IC die 110. In some embodiments test unit 150 provides configuration information to IC die 110 based on such evaluating, which occurs (for example) prior to packaging of IC die 110, prior to an assembly of a package which includes IC die 110, and/or at any of various other stages of manufacture, distribution, or use.

In an embodiment, test unit 150 evaluates a "pseudo-precision resistor" (or "test resistor") of IC die 110, and—based on said evaluation—configures functionality which uses or is otherwise based on the respective resistances of one or more other resistors of IC die 110. The terms "pseudo-precision resistor" and "test resistor" variously refer herein to a resistor of an IC die, wherein a resistance of said resistor is used as a reference for estimating or otherwise determining a resistance of another resistor of that same IC die. In using an on-die test resistor, some embodiments provide an alternative to various conventional techniques, which instead use external, off-die resistor (commonly referred to as a "precision resistor") for reference during the testing of an IC die.

In the example embodiment shown, test unit 150 comprises a current supply circuit 160, a voltage sensor 170, evaluation circuitry 180, and communication circuitry 190 which are variously coupled to hardware interface 152.

Furthermore, a resistor 116 of IC die 110 is coupled to hardware interface 112—i.e., wherein respective conductive contacts 114a, 154a of hardware interfaces 112, 152 couple current supply circuit 160 to resistor 116, and wherein respective conductive contacts 114b, 154b of hardware interfaces 112, 152 couple voltage sensor 170 to resistor 116.

In various embodiments, a resistance of resistor 116 is indicative of a resistance of another resistor of IC die 110 (e.g., wherein said other resistor is provided by the illustrative one or more resistors 144 shown). In one such embodiment, resistor 116 and some or all of the one or more resistors 144 are each of a similar resistor type—e.g., wherein resistor 116 and one or more resistors 144 are each similar with respect to one or more materials, dimensions, and/or other design features. Although resistor 116 is originally designed to provide a particular resistance, resistor 116 is subject to deviating from that designed resistance due to process variations. However, some embodiments nevertheless avail of resistor 116 as a test register for evaluating the respective resistances of one or more other resistors of IC die 110, based on a tendency of those one or more other resistors to be similarly affected by the same process variations.

In one such embodiment, current supply circuit 160 is coupled to conduct a current i1 with resistor 116 via hardware interfaces 112, 152. Furthermore, voltage sensor 170 is coupled to measure a voltage (e.g., at conductive contact 154b of hardware interface 152), wherein the voltage is based on the current i1 and the resistance of resistor 116. In the example embodiment shown, current supply circuit 160 conducts current i1 via conductive contact 154a, and voltage sensor 170 measures a voltage at conductive contact 154b—i.e., wherein IC die 110 electrically shorts conductive contacts 154a, 154b together via conductive contacts 114a, 114b. In an alternative embodiment, voltage sensor 170 instead measures the voltage at the same conductive contact (for example, conductive contact 154a) with which current supply circuit 160 conducts current i1—i.e., wherein resistor 116 is electrically coupled to only one conductive contact of hardware interface 112, and wherein test unit 150 is able to provide an electrical short between current supply circuit 160 and voltage sensor 170.

Evaluation circuitry 180 is coupled to receive from voltage sensor 170 a signal 172 which indicates the voltage across resistor 116. Based on signal 172, evaluation circuitry 180 performs an evaluation of the resistance of resistor 116. For example, evaluation circuitry 180 is further coupled or otherwise preconfigured to identify an amount of the current i1 which current supply circuit 160 conducts with resistor 116, wherein the actual resistance Ract of resistor 116 is evaluated by evaluation circuitry 180 according to equation (1) below.

$$Ract = \frac{Vmeas}{Iinj} \quad (1)$$

In equation (1) above, Vmeas is the voltage measured by voltage sensor 170—e.g., at conductive contact 154b—and Iinj is an amount of the current i1 which is conducted by resistor 116.

Based on identifying of the resistance Ract of resistor 116, evaluation circuitry 180 provides to communication circuitry 190 a signal 182 which specifies or otherwise indicates a scale factor which is to be used to configure IC die 110. As described herein, such a scale factor is used (for example) as a basis for determining a reference voltage to be provided with IC die 110. In one such embodiment, a scale factor (SF) is equal to, otherwise based on, a ratio of the actual resistance Ract of resistor 116 to an expected (designed) resistance Rex of resistor 116—e.g., as represented by equation (2) below.

$$SF = \frac{Ract}{Rex} \quad (2)$$

Given the equations (1) and (2) above, such a scale factor SF can be calculated as a ratio of first value to a second value, wherein the first value represents the measured voltage Vmeas, and wherein the second value represents a product of the amount Iinj of current i1, and the expected resistance Rex of resistor 116. Such a ratio is represented in equation (3) below.

$$SF = \frac{Vmeas}{Iinj * Rex} \quad (3)$$

Based on signal 182, communication circuitry 190 sends to communication circuitry 120 of IC die 110 a signal 122 which includes an indication of the scale factor SF. For example, in various embodiments, signal 182 specifies to communication circuitry 190 the measured resistance Ract—e.g., wherein resistance Ract is in turn identified to communication circuitry 120 via signal 122. In one such embodiment, circuitry of IC die 110—e.g., circuitry which is included in or coupled to communication circuitry 120 or a voltage generator 130—then calculates the scale factor SF based on the resistance Ract. In some alternative embodiments, evaluation circuitry 180 instead calculates the scale factor SF, which is then specified to communication circuitry 190 in signal 182, and similarly specified to communication circuitry 120 in signal 122.

Voltage generator 130 is one example illustration of circuitry which is configurable to operate based on the scale factor which is indicated by signal 122. By way of illustration and not limitation, voltage generator 130 generates a reference voltage 142 which (for example) is provided to an amplifier circuit 140 of IC die 110. In one such embodiment, voltage generator 130 includes, is coupled to, or otherwise operates based on circuitry which is configurable to provide some configuration state (represented by the illustrative state information 131 shown) based on the scale factor indicated by signal 122. For example, voltage generator 130 is programmable and/or otherwise configurable—e.g., based on a signal 124 from communication circuitry 120—to provide reference voltage 142 at a level which is based on the scale factor (as indicated in state information 131).

In various embodiments, reference voltage 142 is provided to one input terminal of amplifier circuit 140, wherein another input terminal of amplifier circuit 140 is coupled to the one or more resistors 144 via a node 146. For example, the one or more resistors 144 are coupled between node 146 and another node which is to receive a voltage v1 (e.g., a reference voltage, such as a ground potential, or a supply voltage). Amplifier circuit 140 provides an output 148, a voltage level of which is based on reference voltage 142 and a voltage at node 146. Although the one or more resistors 144 are shown as being coupled directly to node 146 and the other node, in some embodiments, the one or more resistors 144 is coupled to one such node via switch circuitry.

In one example embodiment, IC die 110 further comprises additional circuitry (not shown) which includes one or more variable resistance circuits and control circuitry coupled thereto. For each of the one or more variable resistance circuits, the control circuitry is to set a respective resistance of the variable resistance circuit—e.g., wherein such setting is based on the output 148 of amplifier circuit 140. In one such embodiment, the one or more variable resistance circuits comprise a pull-up resistor circuit or a pull-down resistor circuit. Additionally or alternatively, the one or more variable resistance circuits comprise an on-die termination circuit. In an embodiment, the control circuitry sets a first resistance of a variable pull-down resistor circuit, and then sets a second resistance of a variable pull-up resistor circuit (e.g., wherein the second resistance is based on the setting of the first resistance). In another embodiment, an adaptive current bias circuit of IC die 110 comprises amplifier circuit 140.

Figure 2:
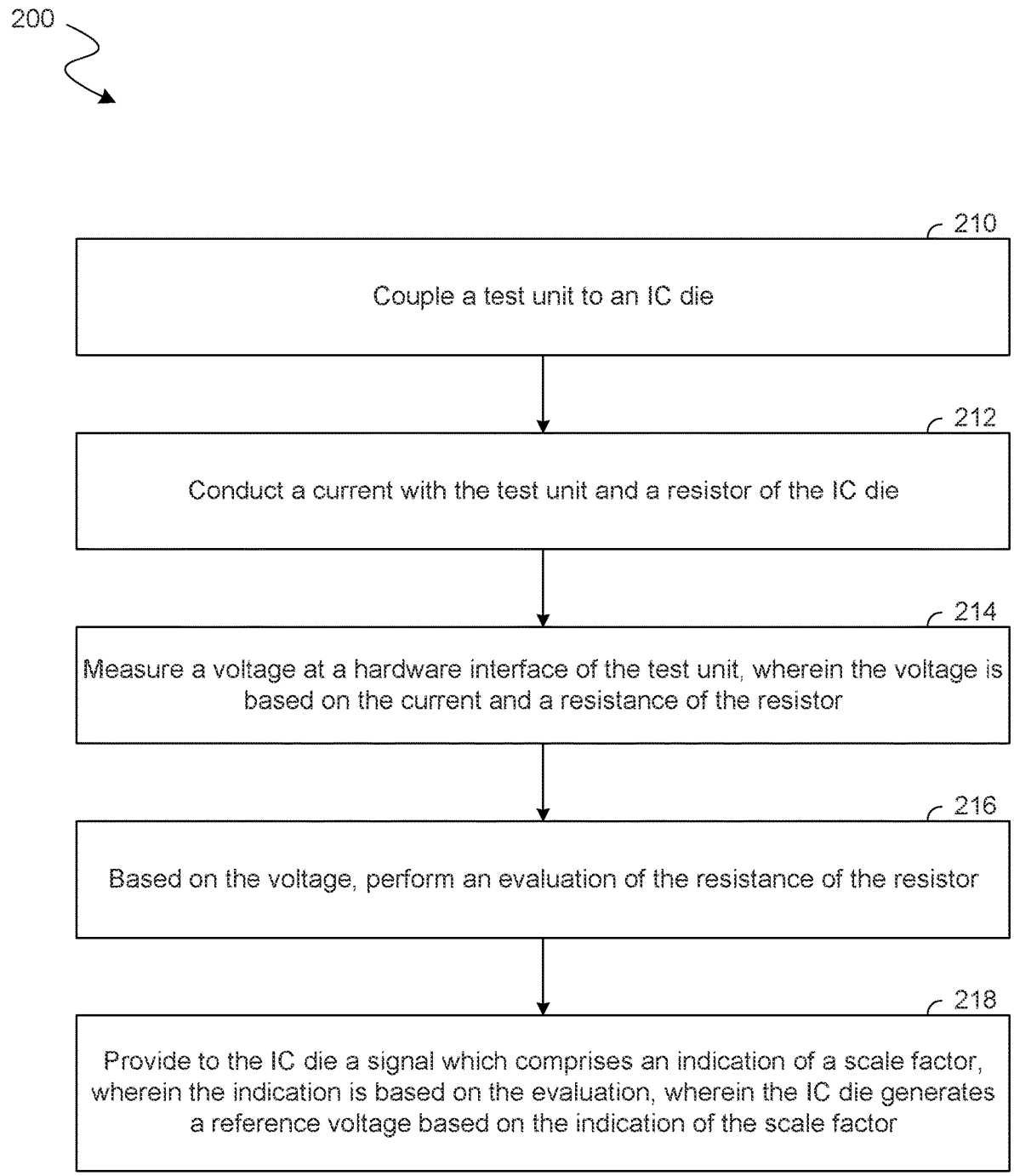
FIG. 2 shows a flow diagram illustrating features of a method to configure an IC die based on an evaluation of a test resistor of an IC die according to an embodiment.

FIG. 2 shows features of a method 200 to configure an IC die based on an evaluation of a test resistor of an IC die according to an embodiment. Method 200 illustrates one example of an embodiment which determines an actual resistance of a pseudo-precision resistor, wherein an IC which includes the pseudo-precision resistor is provided with configuration information based on said resistance. Operations such as those of method 200 are performed, for example, with test unit 150.

As shown in FIG. 2, method 200 comprises (at 210) coupling a test unit to an IC die—e.g., wherein the coupling at 210 comprises coupling test unit 150 and IC die 110 to each other via their respective hardware interface 112, 152. While the test unit is coupled to the IC die, method 200 (at 212) conducts a current with a resistor of the IC die—e.g., wherein the conducting at 212 comprises conducting current i1 with resistor 116. Within the IC die, the resistor is electrically decoupled from any active circuit element of the IC die.

Method 200 further comprises (at 214) measuring a voltage at the hardware interface, wherein the voltage is based on the current and a resistance of the resistor. Based on the voltage measured at 214, method 200 (at 216) performs an evaluation of the resistance of the resistor. For example, the measuring at 214 is performed with voltage sensor 170, wherein the evaluation performed at 216 is based on equation (1) above.

Method 200 further comprises (at 218) providing to the IC die a signal (such as signal 122) which comprises an indication of a scale factor, wherein the indication is determined based on the evaluation performed at 216. In an embodiment, the IC die generates a reference voltage based on the indication of the scale factor. In one such embodiment, method 200 comprises calculating the scale factor based on the evaluation of the resistance—e.g., wherein providing the indication at 218 comprises communicating to the IC die a value which specifies the scale factor. In another embodiment, providing the indication at 218 comprises communicating to the IC die a first value which specifies the resistance of the resistor—e.g., wherein, based on the first value, the IC die subsequently calculates a second value which specifies the scale factor.

Figure 3:
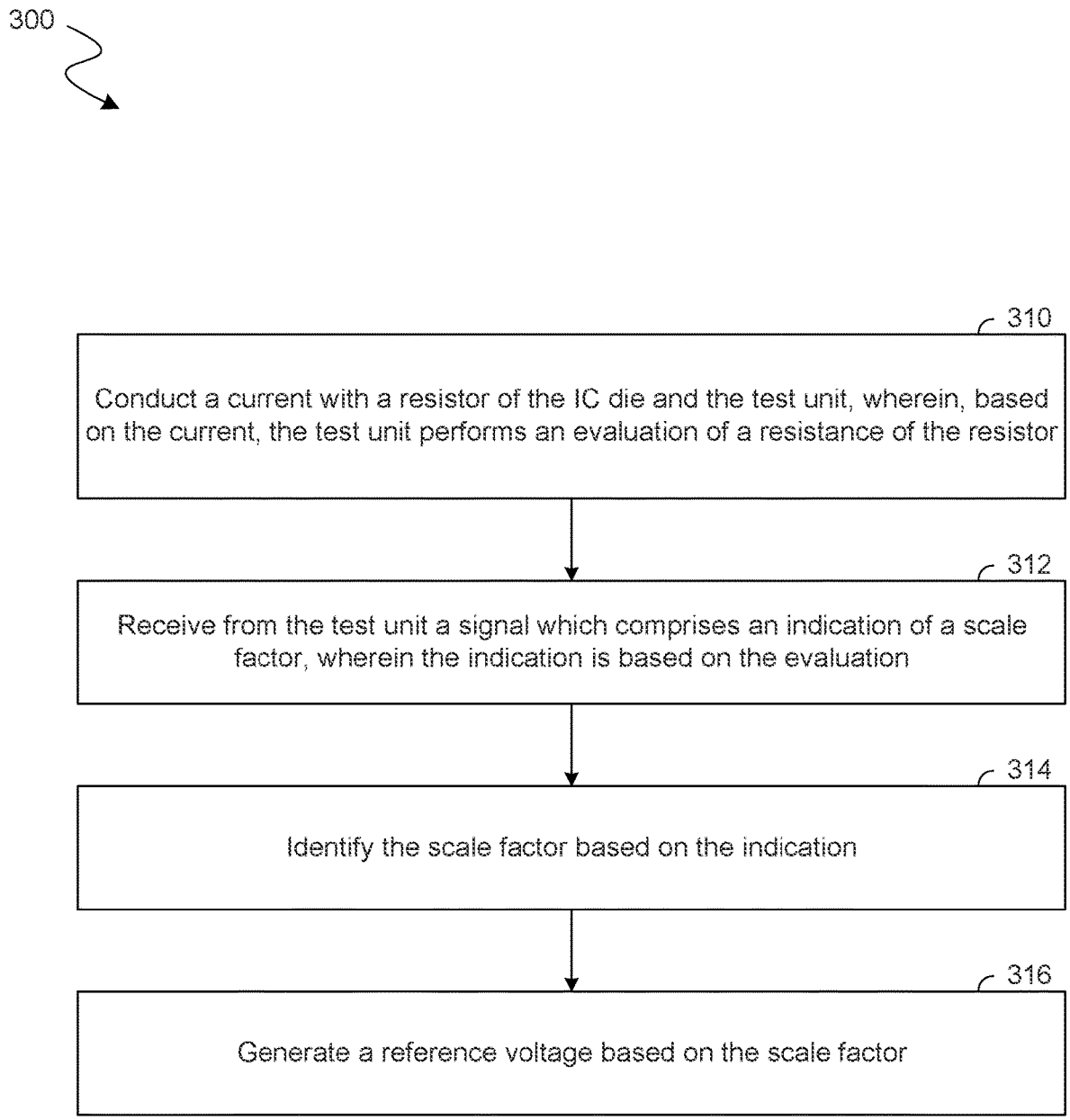
FIG. 3 shows a flow diagram illustrating features of a method to identify a scaling factor to be applied by a voltage generator of an IC die according to an embodiment.

FIG. 3 shows features of a method 300 to identify a scaling factor which is to be applied by a voltage generator of an IC die according to an embodiment. Operations such as those of method 300 are performed, for example, with some or all of IC die 110—e.g., wherein method 300 includes or is otherwise based on operations of method 200.

As shown in FIG. 3, method 300 comprises (at 310) conducting a current with a resistor of the IC die and a test unit which is coupled to the test unit via a hardware interface. In an embodiment, the conducting at 310 includes or is otherwise based on the conducting at 212. In an embodiment, the resistor corresponds functionally to resistor 116—e.g., wherein, within the IC die, the resistor is electrically decoupled from any active circuit element of the IC die. Based on the current conducted at 310, the test unit performs an evaluation of a resistance of the resistor, and (in some embodiments) calculates a scale factor based on the evaluated resistance.

Method 300 further comprises (at 312) receiving from the test unit a signal which comprises an indication of a scale factor, wherein the indication is based on the evaluation of the resistance by the test unit. Based on the indication received at 312, method 300 identifies the scale factor (at 314). For example, in one such embodiment, the indication comprises a value which specifies the scale factor itself—e.g., wherein the test unit calculates the scale factor according to equation (3) above. In another embodiment, the indication comprises a value which specifies the resistance of the resistor, wherein, based on said value, method 300 calculates a second value which specifies the scale factor.

Method 300 further comprises (at 316) generating a reference voltage based on the scale factor. In various embodiments, an amplifier circuit of the IC die (e.g., providing functionality of amplifier circuit 140) is coupled to receive the reference voltage. In one such embodiment, the amplifier circuit is further coupled to one or more other resistors of the IC die—e.g., wherein the one or more other resistors which each have a respective resistance which is substantially equal to (for example, to within 10% of) the resistance of the resistor. The scale factor is indicative of the respective resistances of such one or more other resistors.

In various embodiments, the IC die further comprises one or more variable resistance circuits, wherein, for each of the one or more variable resistance circuits, a respective resistance of the variable resistance circuit is to be set based on an output of the amplifier circuit. For example, the one or more variable resistance circuits comprise a pull-up resistor circuit or a pull-down resistor circuit. Additionally or alternatively, the one or more variable resistance circuits comprise an on-die termination circuit.

In one such embodiment, method 300 further comprises one or more operations (not shown) which, based on the scale factor, set the respective resistances of one or more variable resistance circuits of the IC die. By way of illustration and not limitation, setting the respective resistances comprises setting a first resistance of a variable pull-down resistor circuit. Subsequently, a second resistance of a variable pull-up resistor circuit is set based on the setting of the first resistance of the variable pull-down resistor circuit.

Figure 4:
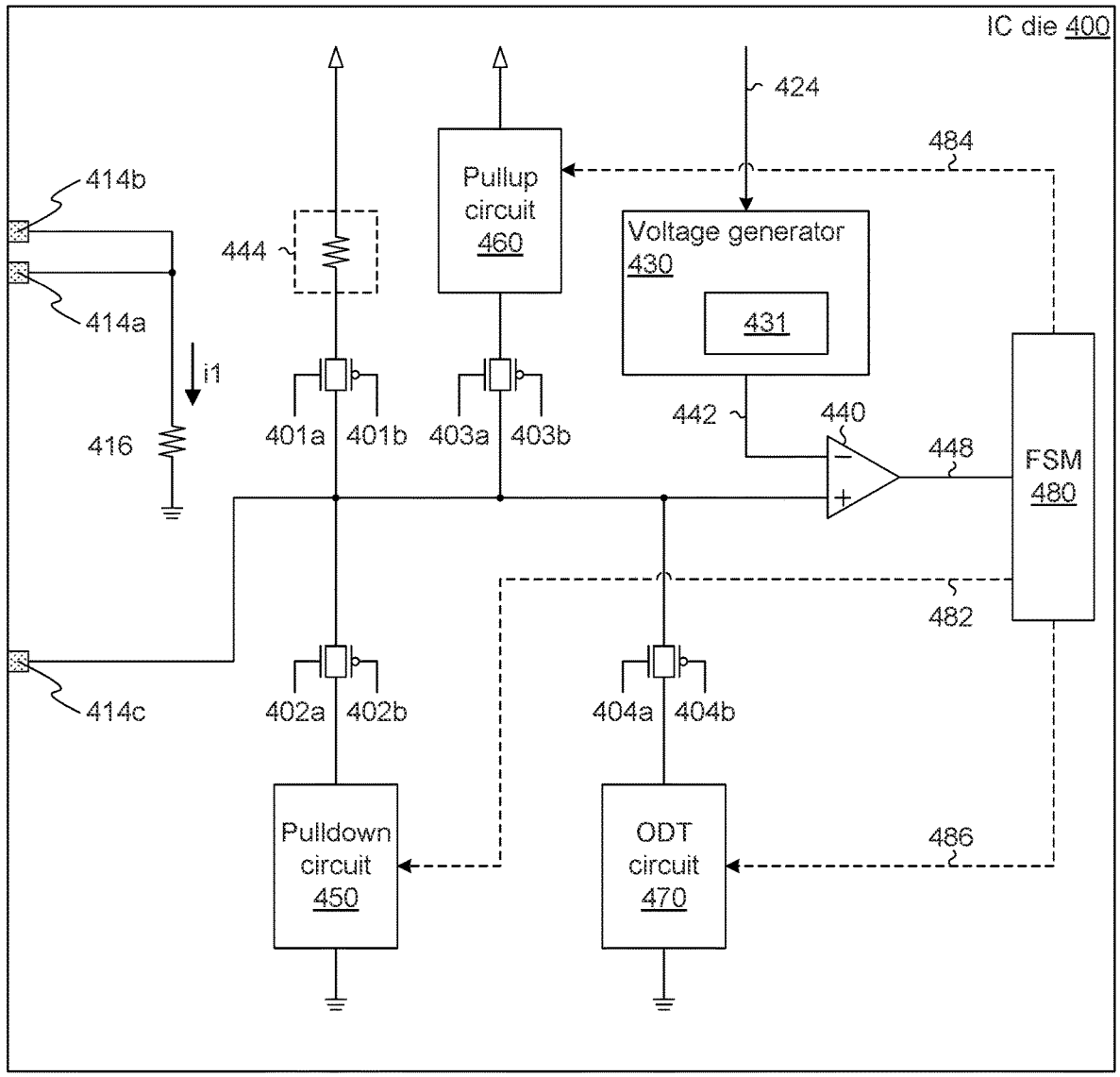
FIG. 4 shows a hybrid circuit and functional block diagram illustrating features of an IC die to tune an impedance of input/output circuitry based on an evaluation of a test resistor according to an embodiment.

FIG. 4 shows features of an IC die 400 which comprises input/output (I/O) circuitry which is tunable based on an evaluation of a test resistor according to an embodiment. IC die 400 illustrates one example of an embodiment wherein an IC die comprises a pseudo-precision resistor, and I/O circuitry which includes (or is otherwise coupled to operate with) one or more resistors which each have a respective resistance which is similar to, or otherwise indicated by, that of the pseudo-precision resistor. In various embodiments, IC die 400 provides functionality such as that of IC die 110—e.g., wherein one or more operations of method 300 are performed with IC die 400.

As shown in FIG. 4, a hardware interface of IC die 400 comprises conductive contacts 414a, 414b which, for example, correspond functionally to conductive contacts 114*a*, 114*b* (respectively). IC die 400 further comprises a resistor 416, a voltage generator 430, and an amplifier circuit 440 which—for example—provide functionality of resistor 116, voltage generator 130, and amplifier circuit 140 (respectively).

In an embodiment, voltage generator 430 is configured with state information 431 based on a signal 424 which specifies or otherwise indicates a scale factor that is specified or otherwise indicated to IC die 400 by a test unit (such as test unit 150). The scale factor is determined, for example, by an evaluation of resistor 416 by the test unit. Signal 424 and state information 431 correspond functionally to signal 124 and state information 131 (respectively), in various embodiments.

IC die 400 comprises one or more resistors 444, some or all of which each have a respective resistance that is equal to, or is otherwise indicated by, the resistance of resistor 416. In one such embodiment, a total resistance provided by one or more resistors 444 is less than a resistance of resistor 416—e.g., wherein the one or more resistors 444 comprises multiple similar resistors which are coupled in parallel with each other. By way of illustration and not limitation, in one such embodiment, resistor 416 is designed to provide a resistance of 1500 Ohms (Ω), wherein the one or more resistors 444 are designed to provide a total resistance of 500Ω. In an embodiment, the scale factor indicated by signal 424 is equal to, or otherwise based on, a ratio of an actual resistance of resistor 416 to a designed (expected) resistance of resistor 416. Voltage generator 430 provides to a negative input terminal of amplifier circuit 440 a reference voltage 442, a level of which is based on the scale factor. A positive input terminal of amplifier circuit 440 is coupled to the various switch circuits and, for example, to another conductive contact 414*c* which is to transmit signals from IC die 400 and/or to receive signals communicated to IC die 400. Although conductive contact 414*c* is shown as supporting transceiver functionality, other embodiments facilitate calibration processes for a conductive contact which supports only one of a transmit functionality, or a receive functionality.

In various embodiments, I/O circuitry of IC die 400 comprises one or more variable resistance circuits, wherein, for each of the one or more variable resistance circuits, a respective resistance of the variable resistance circuit is to be set based on an output 448 of amplifier circuit 440. For example, the one or more variable resistance circuits comprise a pullup circuit 460, and a pulldown circuit 450. Additionally or alternatively, the one or more variable resistance circuits comprise an on-die termination (ODT) circuit 470.

In one such embodiment, switch control signals 401*a*, 401*b* operate a first switch circuit of IC die 400 to selectively provide (or prevent) a conductive path between the one or more resistors 444 and a positive input terminal of amplifier circuit 440. Furthermore, switch control signals 402*a*, 402*b* operate a second switch circuit of IC die 400 to selectively provide (or prevent) a conductive path between pulldown circuit 450 and the positive input terminal of amplifier circuit 440. Further still, switch control signals 403*a*, 403*b* operate a third switch circuit of IC die 400 to selectively provide (or prevent) a conductive path between pullup circuit 460 and the positive input terminal of amplifier circuit 440. Additionally or alternatively, switch control signals 404*a*, 404*b* operate a fourth switch circuit of IC die 400 to selectively provide (or prevent) a conductive path between ODT circuit 470 and the positive input terminal of amplifier circuit 440. Some or all of switch control signals 401*a*, 401*b*, 402*a*, 402*b*, 403*a*, 403*b*, 404*a*, 404*b* are generated, for example, by the illustrative finite state machine (FSM) 480 shown, or by other suitable control circuitry of IC die 400 which, for example, operates in combination with FSM 480.

In an illustrative scenario according to one embodiment, a pull down calibration procedure comprises providing conductive paths—the providing based on switch control signals 401*a*, 401*b* and switch control signals 402*a*, 402*b*—each between amplifier circuit 440 and a respective one of pulldown circuit 450 or the one or more resistors 444. Concurrently, based on switch control signals 403*a*, 403*b* and switch control signals 404*a*, 404*b*, conductive paths are prevented between amplifier circuit 440 and both pullup circuit 460 and ODT circuit 470. During such a configuration of the switch circuits, reference voltage 442 is provided at a level Vref1 which, for example, is represented by the equation (4) shown below.

$$Vref1 = \frac{Rdex}{Rdi + (SF)(R1ex)}[Vcc] \qquad (4)$$

In the above equation (4), SF is the scale factor, Rlex is an expected total resistance which the one or more resistors 444 were originally designed to provide, and Rdi is a predetermined ideal resistance to be provided by pulldown circuit 450. During the pull down calibration, output 448 represents a difference between reference voltage 442 and a voltage at the positive input terminal of amplifier circuit 440. FSM 480 provides a control signal 482, based on output 448, to change a variable resistance of pulldown circuit 450 until the voltage difference indicated by output 448 is zero (or otherwise sufficiently negligible).

In one such embodiment, a pull up calibration procedure comprises providing conductive paths—the providing based on switch control signals 402*a*, 402*b* and switch control signals 403*a*, 403*b*—each between amplifier circuit 440 and a respective one of pulldown circuit 450 or pullup circuit 460. Concurrently, based on switch control signals 401*a*, 401*b* and switch control signals 404*a*, 404*b*, conductive paths are prevented between amplifier circuit 440 and each of ODT circuit 470 and the one or more resistors 444. During such a state of the switch circuits, reference voltage 442 is provided at a level Vref2 which, for example, is represented by the equation (5) shown below.

$$Vref2 = \frac{Rui}{Rdcal}[Vcc] \qquad (5)$$

In the above equation (5), Rui is a predetermined ideal resistance to be provided by pullup circuit 460, and Rdcal is the resistance of pulldown circuit 450 which was previously configured, during the pull down calibration, based on control signal 482. During the pull up calibration, FSM 480 provides a control signal 484, based on output 448, to change a variable resistance of pullup circuit 460 until a voltage difference indicated by output 448 is zero (or otherwise sufficiently negligible).

An ODT calibration according to some embodiments is performed in a way which is similar to the above-described pull down calibration process. For example, ODT calibration takes place while conductive paths are provided each between amplifier circuit 440 and a respective one of ODT circuit 470 or the one or more resistors 444, and while other conductive paths—each between amplifier circuit 440 and a respective one of pulldown circuit 450 or pullup circuit 460—are prevented. During such a state of the switch circuitry, reference voltage 442 is provided at a level Vref3 which, for example, is represented by the equation (6) shown below.

$$Vref3 = \frac{Roi}{Roi + (SF)(R1ex)}[Vcc] \quad (6)$$

In the above equation (6), Roi is a predetermined ideal resistance to be provided by ODT circuit 470. During the ODT calibration, FSM 480 provides a control signal 486, based on output 448, to change a variable resistance of ODT circuit 470 until the voltage difference indicated by output 448 is sufficiently negligible.

Figure 5:
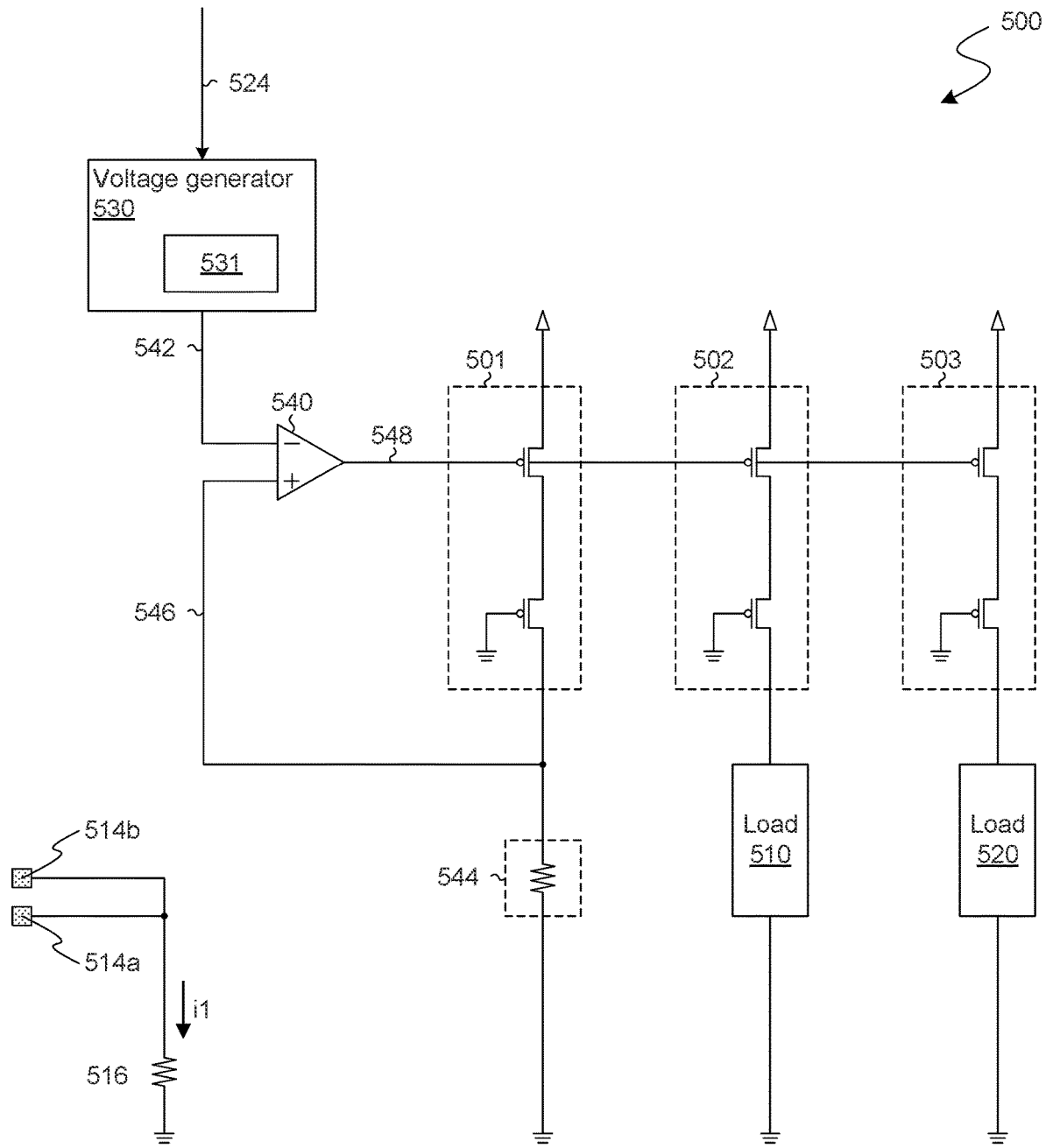
FIG. 5 shows a hybrid circuit and functional block diagram illustrating features of an IC die to tune current generation circuitry based on an evaluation of a test resistor according to an embodiment.

FIG. 5 shows features of an IC die 500 to adaptively tune a current bias based on an evaluation of a test resistor according to an embodiment. In various embodiments, IC die 500 provides functionality such as that of IC die 110—e.g., wherein one or more operations of method 300 are performed with IC die 500.

As shown in FIG. 5, a hardware interface of IC die 500 comprises conductive contacts 514a, 514b which, for example, correspond functionally to conductive contacts 114a, 114b (respectively). IC die 500 further comprises a resistor 516, a voltage generator 530, and a differential amplifier 540 which—for example—provide functionality of resistor 116, voltage generator 130, and amplifier circuit 140 (respectively). In an embodiment, voltage generator 530 is configured with state information 531 based on a signal 524 which specifies or otherwise indicates a scale factor that is specified or otherwise indicated to IC die 500 by a test unit (such as test unit 150). The scale factor is determined, for example, by an evaluation of resistor 516 (such as resistor 116) by the test unit. Signal 524 and state information 531 correspond functionally to signal 124 and state information 131 (respectively), in various embodiments.

IC die 500 further comprises one or more resistors 544, some or all of which each have a respective resistance that is equal to, or is otherwise indicated by, the resistance of resistor 516. For example, the one or more resistors 544 correspond functionally to the one or more resistors 144. In one such embodiment, a total resistance provided by one or more resistors 544 is less than a resistance of resistor 516—e.g., wherein the one or more resistors 544 comprises multiple similar resistors which are coupled in parallel with each other.

The one or more resistors 544 are coupled, for example, to conduct current with an output stage 501 of IC die 500, wherein the current is based on an output voltage 548 from differential amplifier 540. In the example embodiment shown, output stage 501 comprises a first p-type output stage transistor, which is coupled to receive output voltage 548, and a feedback network coupling the one or more resistors 544 to an input of the differential amplifier 540. Although some embodiments are not limited in this regard, output stage 501 further comprises a second p-type transistor which coupled in series between the first p-type transistor and the one or more resistors 544—e.g., where the second p-type transistor is always on during operation of IC die 500.

Differential amplifier 540 generates voltage 548 based on a reference voltage 542 from differential amplifier 540—e.g., wherein reference voltage 542 is based on the state information 531 (which, in turn, is based on the scale factor indicated by signal 524). In an embodiment, voltage 548 is based on a difference between reference voltage 542, and a feedback voltage feedback voltage 546 which is generated with the one or more resistors 544 and output stage 501. Accordingly, feedback voltage 546 facilitates a regulation of output voltage 548, which in turn regulates the respective biases of one or more currents which are provided each to a respective load circuit.

By way of illustration and not limitation, output voltage 548 further determines a conduction of a current with an output stage 502 and a load 510 which is coupled thereto. Additionally or alternatively, output voltage 548 determines the conduction of another current with an output stage 503 and an additional load 520 which is coupled thereto. In other embodiments, one or more load circuits (e.g., load 510 and/or load 520) are provided with current by IC die 500, but are external to IC die 500. Furthermore, it is to be appreciated that the number of output stages and load circuits shown in FIG. 5 is merely illustrative, and not limiting on certain embodiments.

Figure 6:
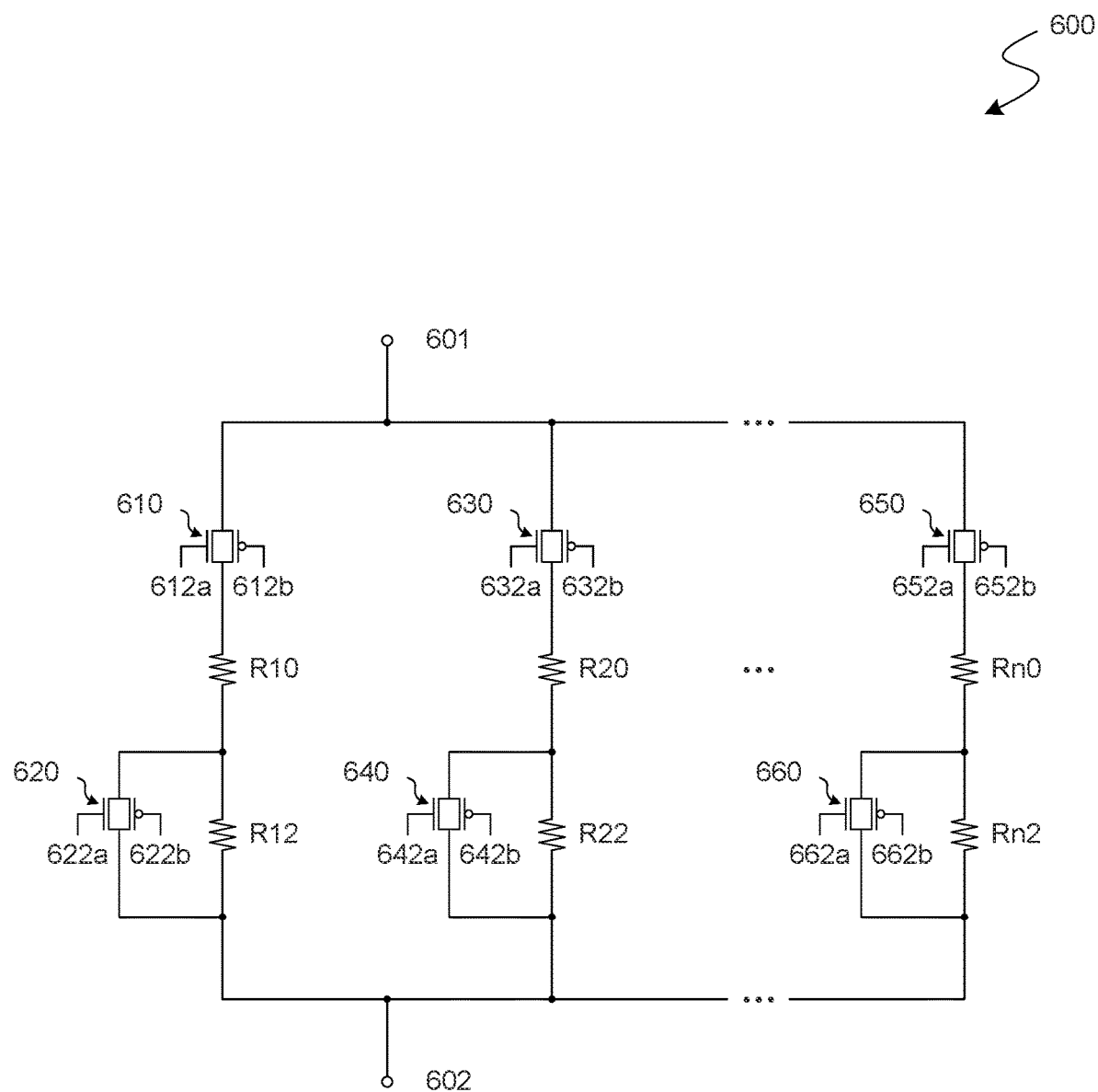
FIG. 6 shows a circuit diagram illustrating features of a variable resistance circuit to be tuned based on an evaluation of a test resistor of an IC die according to an embodiment.

FIG. 6 shows features of a variable resistance circuit 600 to be tuned based on an evaluation of a test resistor of an IC die according to an embodiment. Variable resistance circuit 600 illustrates circuitry which is to be configured based on a scale factor, wherein the scale factor is determined based on the evaluation of a test resistor of an IC die. In various embodiments, variable resistance circuit 600 provides functionality such as that of pulldown circuit 450, pullup circuit 460, or ODT circuit 470—e.g., wherein one or more operations of method 300 are performed with variable resistance circuit 600.

As shown in FIG. 6, variable resistor 600 comprises n circuit networks (where n is a positive integer) which are coupled in parallel with each other between two nodes 601, 602. For example, a first circuit network of variable resistance circuit 600 comprises resistors R10, R12, wherein, responsive to control signals 612a, 612b, a switch circuit 610 is to selectively enable (or disable) any current conduction with the first circuit network. Responsive to control signals 622a, 622b, another switch circuit 620 is to selectively enable (or disable) a bypassing of resistor R12. Furthermore, a second circuit network of variable resistance circuit 600 comprises resistors R20, R22, wherein, responsive to control signals 632a, 632b, a switch circuit 630 is to selectively enable (or disable) any current conduction with the second circuit network. Responsive to control signals 642a, 642b, another switch circuit 640 is to selectively enable (or disable) a bypassing of resistor R22. Further still, a third circuit network of variable resistance circuit 600 comprises resistors Rn0, Rn2, wherein, responsive to control signals 652a, 652b, a switch circuit 650 is to selectively enable (or disable) any current conduction with the third circuit network. Responsive to control signals 662a, 662b, another switch circuit 660 is to selectively enable (or disable) a bypassing of resistor Rn2.

Figure 7:
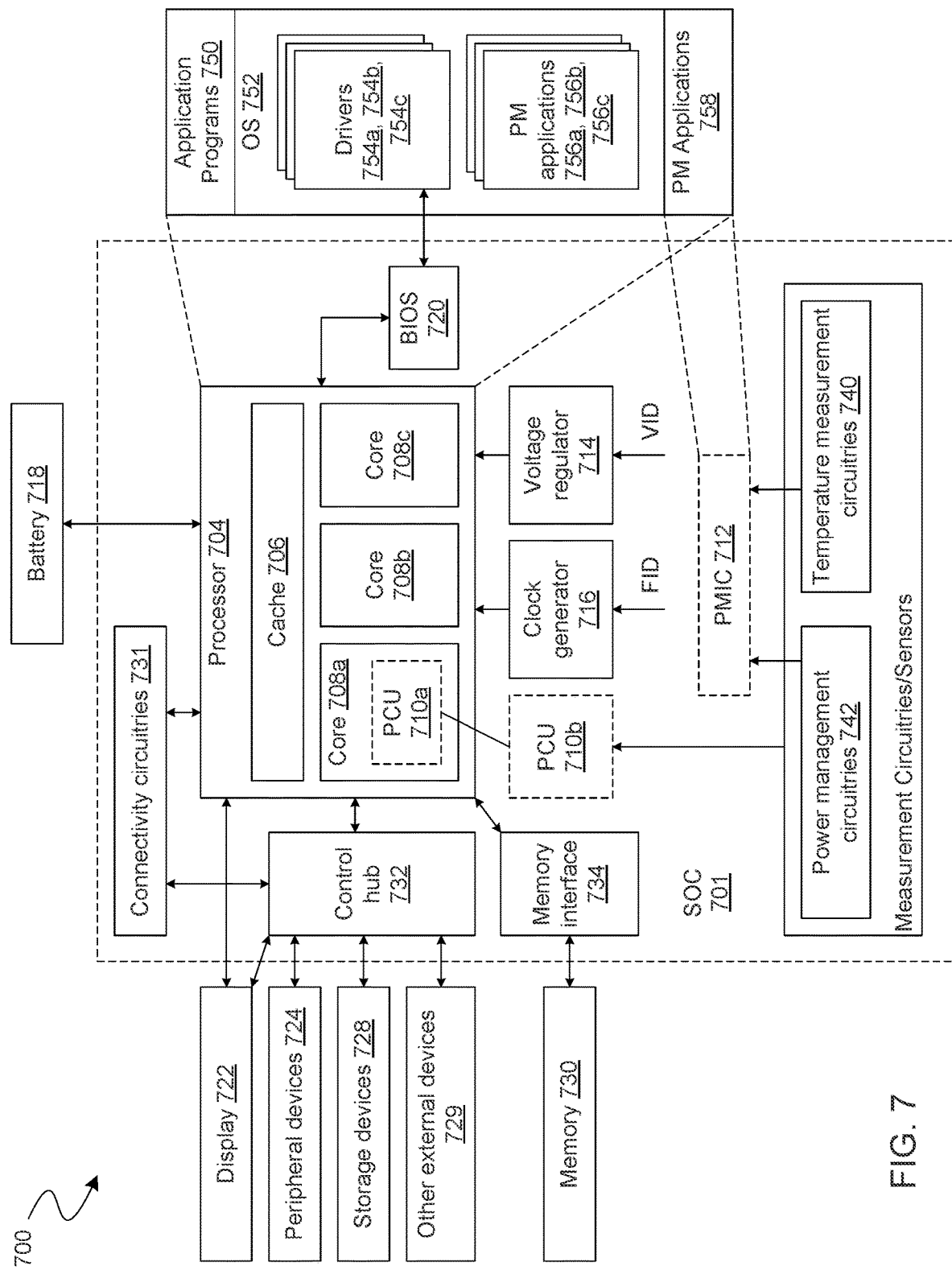
FIG. 7 shows a functional block diagram illustrating features of a computing device to provide a reference voltage based on an evaluation of a test resistor of an IC die according to an embodiment.

FIG. 7 illustrates a computer system or computing device 700 (also referred to as device 700), where a resistance of an IC die is tuned, in accordance with some embodiments. It is pointed out that those elements of FIG. 7 having the same reference numbers (or names) as the elements of any other figure can operate or function in any manner similar to that described, but are not limited to such.

In some embodiments, device 700 represents an appropriate computing device, such as a computing tablet, a mobile phone or smart-phone, a laptop, a desktop, an Internet-of-Things (IoT) device, a server, a wearable device, a set-top box, a wireless-enabled e-reader, or the like. It will be understood that certain components are shown generally, and not all components of such a device are shown in device 700.

In an example, the device 700 comprises a SoC (System-on-Chip) 701. An example boundary of the SOC 701 is illustrated using dotted lines in FIG. 7, with some example components being illustrated to be included within SOC 701—however, SOC 701 may include any appropriate components of device 700.

In some embodiments, device 700 includes processor 704. Processor 704 can include one or more physical devices, such as microprocessors, application processors, microcontrollers, programmable logic devices, processing cores, or other processing means. The processing operations performed by processor 704 include the execution of an operating platform or operating system on which applications and/or device functions are executed. The processing operations include operations related to I/O (input/output) with a human user or with other devices, operations related to power management, operations related to connecting computing device 700 to another device, and/or the like. The processing operations may also include operations related to audio I/O and/or display I/O.

In some embodiments, processor 704 includes multiple processing cores (also referred to as cores) 708a, 708b, 708c. Although merely three cores 708a, 708b, 708c are illustrated in FIG. 7, the processor 704 may include any other appropriate number of processing cores, e.g., tens, or even hundreds of processing cores. Processor cores 708a, 708b, 708c may be implemented on a single integrated circuit (IC) chip. Moreover, the chip may include one or more shared and/or private caches, buses or interconnections, graphics and/or memory controllers, or other components.

In some embodiments, processor 704 includes cache 706. In an example, sections of cache 706 may be dedicated to individual cores 708 (e.g., a first section of cache 706 dedicated to core 708a, a second section of cache 706 dedicated to core 708b, and so on). In an example, one or more sections of cache 706 may be shared among two or more of cores 708. Cache 706 may be split in different levels, e.g., level 1 (L1) cache, level 2 (L2) cache, level 3 (L3) cache, etc.

In some embodiments, a given processor core (e.g., core 708a) may include a fetch unit to fetch instructions (including instructions with conditional branches) for execution by the core 708a. The instructions may be fetched from any storage devices such as the memory 730. Processor core 708a may also include a decode unit to decode the fetched instruction. For example, the decode unit may decode the fetched instruction into a plurality of micro-operations. Processor core 708a may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 708a (for example) may be an out-of-order processor core in one embodiment. Processor core 708a may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 708a may also include a bus unit to enable communication between components of the processor core 708a and other components via one or more buses. Processor core 708a may also include one or more registers to store data accessed by various components of the core 708a (such as values related to assigned app priorities and/or sub-system states (modes) association.

In some embodiments, device 700 comprises connectivity circuitries 731. For example, connectivity circuitries 731 includes hardware devices (e.g., wireless and/or wired connectors and communication hardware) and/or software components (e.g., drivers, protocol stacks), e.g., to enable device 700 to communicate with external devices. Device 700 may be separate from the external devices, such as other computing devices, wireless access points or base stations, etc.

In an example, connectivity circuitries 731 may include multiple different types of connectivity. To generalize, the connectivity circuitries 731 may include cellular connectivity circuitries, wireless connectivity circuitries, etc. Cellular connectivity circuitries of connectivity circuitries 731 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 731 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 731 may include a network interface, such as a wired or wireless interface, e.g., so that a system embodiment may be incorporated into a wireless device, for example, cell phone or personal digital assistant.

In some embodiments, device 700 comprises control hub 732, which represents hardware devices and/or software components related to interaction with one or more I/O devices. For example, processor 704 may communicate with one or more of display 722, one or more peripheral devices 724, storage devices 728, one or more other external devices 729, etc., via control hub 732. Control hub 732 may be a chipset, a Platform Control Hub (PCH), and/or the like.

For example, control hub 732 illustrates one or more connection points for additional devices that connect to device 700, e.g., through which a user might interact with the system. For example, devices (e.g., devices 729) that can be attached to device 700 include microphone devices, speaker or stereo systems, audio devices, video systems or other display devices, keyboard or keypad devices, or other I/O devices for use with specific applications such as card readers or other devices.

As mentioned above, control hub 732 can interact with audio devices, display 722, etc. For example, input through a microphone or other audio device can provide input or commands for one or more applications or functions of device 700. Additionally, audio output can be provided instead of, or in addition to display output. In another example, if display 722 includes a touch screen, display 722 also acts as an input device, which can be at least partially managed by control hub 732. There can also be additional buttons or switches on computing device 700 to provide I/O functions managed by control hub 732. In one embodiment, control hub 732 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In some embodiments, control hub 732 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 722 represents hardware (e.g., display devices) and software (e.g., drivers) components that provide a visual and/or tactile display for a user to interact with device 700. Display 722 may include a display interface, a display screen, and/or hardware device used to provide a display to a user. In some embodiments, display 722 includes a touch screen (or touch pad) device that provides both output and input to a user. In an example, display 722 may communicate directly with the processor 704. Display 722 can be one or more of an internal display device, as in a mobile electronic device or a laptop device or an external display device attached via a display interface (e.g., DisplayPort, etc.). In one embodiment display 722 can be a head mounted display (HMD) such as a stereoscopic display device for use in virtual reality (VR) applications or augmented reality (AR) applications.

In some embodiments and although not illustrated in the figure, in addition to (or instead of) processor 704, device 700 may include Graphics Processing Unit (GPU) comprising one or more graphics processing cores, which may control one or more aspects of displaying contents on display 722.

Control hub 732 (or platform controller hub) may include hardware interfaces and connectors, as well as software components (e.g., drivers, protocol stacks) to make peripheral connections, e.g., to peripheral devices 724.

It will be understood that device 700 could both be a peripheral device to other computing devices, as well as have peripheral devices connected to it. Device 700 may have a "docking" connector to connect to other computing devices for purposes such as managing (e.g., downloading and/or uploading, changing, synchronizing) content on device 700. Additionally, a docking connector can allow device 700 to connect to certain peripherals that allow computing device 700 to control content output, for example, to audiovisual or other systems.

In addition to a proprietary docking connector or other proprietary connection hardware, device 700 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 731 may be coupled to control hub 732, e.g., in addition to, or instead of, being coupled directly to the processor 704. In some embodiments, display 722 may be coupled to control hub 732, e.g., in addition to, or instead of, being coupled directly to processor 704.

In some embodiments, device 700 comprises memory 730 coupled to processor 704 via memory interface 734. Memory 730 includes memory devices for storing information in device 700. Memory can include nonvolatile (state does not change if power to the memory device is interrupted) and/or volatile (state is indeterminate if power to the memory device is interrupted) memory devices. Memory device 730 can be a dynamic random access memory (DRAM) device, a static random access memory (SRAM) device, flash memory device, phase-change memory device, or some other memory device having suitable performance to serve as process memory. In one embodiment, memory 730 can operate as system memory for device 700, to store data and instructions for use when the one or more processors 704 executes an application or process. Memory 730 can store application data, user data, music, photos, documents, or other data, as well as system data (whether long-term or temporary) related to the execution of the applications and functions of device 700.

Elements of various embodiments and examples are also provided as a machine-readable medium (e.g., memory 730) for storing the computer-executable instructions (e.g., instructions to implement any other processes discussed herein). The machine-readable medium (e.g., memory 730) may include, but is not limited to, flash memory, optical disks, CD-ROMs, DVD ROMs, RAMS, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 700 comprises temperature measurement circuitries 740, e.g., for measuring temperature of various components of device 700. In an example, temperature measurement circuitries 740 may be embedded, or coupled or attached to various components, whose temperature are to be measured and monitored. For example, temperature measurement circuitries 740 may measure temperature of (or within) one or more of cores 708a, 708b, 708c, voltage regulator 714, memory 730, a mother-board of SOC 701, and/or any appropriate component of device 700.

In some embodiments, device 700 comprises power measurement circuitries 742, e.g., for measuring power consumed by one or more components of the device 700. In an example, in addition to, or instead of, measuring power, the power measurement circuitries 742 may measure voltage and/or current. In an example, the power measurement circuitries 742 may be embedded, or coupled or attached to various components, whose power, voltage, and/or current consumption are to be measured and monitored. For example, power measurement circuitries 742 may measure power, current and/or voltage supplied by one or more voltage regulators 714, power supplied to SOC 701, power supplied to device 700, power consumed by processor 704 (or any other component) of device 700, etc.

In some embodiments, device 700 comprises one or more voltage regulator circuitries, generally referred to as voltage regulator (VR) 714. VR 714 generates signals at appropriate voltage levels, which may be supplied to operate any appropriate components of the device 700. Merely as an example, VR 714 is illustrated to be supplying signals to processor 704 of device 700. In some embodiments, VR 714 receives one or more Voltage Identification (VID) signals, and generates the voltage signal at an appropriate level, based on the VID signals. Various type of VRs may be utilized for the VR 714. For example, VR 714 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 710a/b and/or PMIC 712. In some embodiments, each core has a network of distributed LDOs to provide efficient control for power management. The LDOs can be digital, analog, or a combination of digital or analog LDOs.

In some embodiments, device 700 comprises one or more clock generator circuitries, generally referred to as clock generator 716. Clock generator 716 generates clock signals at appropriate frequency levels, which may be supplied to any appropriate components of device 700. Merely as an example, clock generator 716 is illustrated to be supplying clock signals to processor 704 of device 700. In some embodiments, clock generator 716 receives one or more Frequency Identification (FID) signals, and generates the clock signals at an appropriate frequency, based on the FID signals.

In some embodiments, device 700 comprises battery 718 supplying power to various components of device 700. Merely as an example, battery 718 is illustrated to be supplying power to processor 704. Although not illustrated in the figures, device 700 may comprise a charging circuitry, e.g., to recharge the battery, based on Alternating Current (AC) power supply received from an AC adapter.

In some embodiments, device 700 comprises Power Control Unit (PCU) 710 (also referred to as Power Management Unit (PMU), Power Controller, etc.). In an example, some sections of PCU 710 may be implemented by one or more processing cores 708, and these sections of PCU 710 are symbolically illustrated using a dotted box and labelled PCU 710a. In an example, some other sections of PCU 710 may be implemented outside the processing cores 708, and these sections of PCU 710 are symbolically illustrated using a dotted box and labelled as PCU 710b. PCU 710 may implement various power management operations for device 700. PCU 710 may include hardware interfaces, hardware circuitries, connectors, registers, etc., as well as software components (e.g., drivers, protocol stacks), to implement various power management operations for device 700.

In some embodiments, device 700 comprises Power Management Integrated Circuit (PMIC) 712, e.g., to implement various power management operations for device 700. In some embodiments, PMIC 712 is a Reconfigurable Power Management ICs (RPMICs) and/or an IMVP (Intel® Mobile Voltage Positioning). In an example, the PMIC is within an IC chip separate from processor 704. The may implement various power management operations for device 700. PMIC 712 may include hardware interfaces, hardware circuitries, connectors, registers, etc., as well as software components (e.g., drivers, protocol stacks), to implement various power management operations for device 700.

In an example, device 700 comprises one or both PCU 710 or PMIC 712. In an example, any one of PCU 710 or PMIC 712 may be absent in device 700, and hence, these components are illustrated using dotted lines.

Various power management operations of device 700 may be performed by PCU 710, by PMIC 712, or by a combination of PCU 710 and PMIC 712. For example, PCU 710 and/or PMIC 712 may select a power state (e.g., P-state) for various components of device 700. For example, PCU 710 and/or PMIC 712 may select a power state (e.g., in accordance with the ACPI (Advanced Configuration and Power Interface) specification) for various components of device 700. Merely as an example, PCU 710 and/or PMIC 712 may cause various components of the device 700 to transition to a sleep state, to an active state, to an appropriate C state (e.g., CO state, or another appropriate C state, in accordance with the ACPI specification), etc. In an example, PCU 710 and/or PMIC 712 may control a voltage output by VR 714 and/or a frequency of a clock signal output by the clock generator, e.g., by outputting the VID signal and/or the FID signal, respectively. In an example, PCU 710 and/or PMIC 712 may control battery power usage, charging of battery 718, and features related to power saving operation.

The clock generator 716 can comprise a phase locked loop (PLL), frequency locked loop (FLL), or any suitable clock source. In some embodiments, each core of processor 704 has its own clock source. As such, each core can operate at a frequency independent of the frequency of operation of the other core. In some embodiments, PCU 710 and/or PMIC 712 performs adaptive or dynamic frequency scaling or adjustment. For example, clock frequency of a processor core can be increased if the core is not operating at its maximum power consumption threshold or limit. In some embodiments, PCU 710 and/or PMIC 712 determines the operating condition of each core of a processor, and opportunistically adjusts frequency and/or power supply voltage of that core without the core clocking source (e.g., PLL of that core) losing lock when the PCU 710 and/or PMIC 712 determines that the core is operating below a target performance level. For example, if a core is drawing current from a power supply rail less than a total current allocated for that core or processor 704, then PCU 710 and/or PMIC 712 can temporarily increase the power draw for that core or processor 704 (e.g., by increasing clock frequency and/or power supply voltage level) so that the core or processor 704 can perform at a higher performance level. As such, voltage and/or frequency can be increased temporality for processor 704 without violating product reliability.

In an example, PCU 710 and/or PMIC 712 may perform power management operations, e.g., based at least in part on receiving measurements from power measurement circuitries 742, temperature measurement circuitries 740, charge level of battery 718, and/or any other appropriate information that may be used for power management. To that end, PMIC 712 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 710 and/or PMIC 712 in at least one embodiment to allow PCU 710 and/or PMIC 712 to manage processor core energy at least in part based on value(s) detected by one or more of the sensors.

Also illustrated is an example software stack of device 700 (although not all elements of the software stack are illustrated). Merely as an example, processors 704 may execute application programs 750, Operating System 752, one or more Power Management (PM) specific application programs (e.g., generically referred to as PM applications 758), and/or the like. PM applications 758 may also be executed by the PCU 710 and/or PMIC 712. OS 752 may also include one or more PM applications 756a, 756b, 756c. The OS 752 may also include various drivers 754a, 754b, 754c, etc., some of which may be specific for power management purposes. In some embodiments, device 700 may further comprise a Basic Input/Output System (BIOS) 720. BIOS 720 may communicate with OS 752 (e.g., via one or more drivers 754), communicate with processors 704, etc.

For example, one or more of PM applications 758, 756, drivers 754, BIOS 720, etc. may be used to implement power management specific tasks, e.g., to control voltage and/or frequency of various components of device 700, to control wake-up state, sleep state, and/or any other appropriate power state of various components of device 700, control battery power usage, charging of the battery 718, features related to power saving operation, etc.

In various embodiments, connectivity circuitries 731 comprise I/O circuitry with which SoC 701 is to communicate with other hardware (such as hardware which computing device 701 includes or, alternatively, is to couple to). Such I/O circuitry connectivity circuitries 731 incudes a variable resistance circuit (not shown) that, for example, provide functionality such as that of one or more resistors 144. In one such embodiment, SoC 701 comprises a test resistor (not shown) that, for example, provides functionality such as that of resistor 116. The I/O circuitry of connectivity circuitries 731 incudes, is coupled to, or otherwise operates based on circuit logic which provides functionality (such as that of communication circuitry 120 and/or voltage generator 130) to tune or otherwise configure the variable resistance circuit—e.g., based on an evaluation of a resistance provided by the test resistor.

Techniques and architectures for tuning a resistance of an IC die are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

In one or more first embodiments, an integrated circuit (IC) die comprises a hardware interface to couple the IC die to a test unit, a resistor coupled to the hardware interface, the resistor to conduct a current with the test unit when the hardware interface is coupled to the test unit, wherein, based on the current, the test unit is to perform an evaluation of a resistance of the resistor, first circuitry to receive a signal from the test unit via the hardware interface, wherein the signal is to comprise an indication of a scale factor, wherein the indication is based on the evaluation, and second circuitry to identify the scale factor based on the indication, and to generate a reference voltage based on the scale factor.

In one or more second embodiments, further to the first embodiment, within the IC die, the resistor is electrically decoupled from any active circuit element of the IC die.

In one or more third embodiments, further to the first embodiment or the second embodiment, the indication is to comprise a value which specifies the scale factor.

In one or more fourth embodiments, further to any of the first through third embodiments, providing the indication comprises communicating to the IC die a first value which specifies the resistance of the resistor, and wherein, based on the first value, the IC die calculates a second value which specifies the scale factor.

In one or more fifth embodiments, further to the fourth embodiment, the scale factor is calculated based on a ratio of a first value to a second value, wherein the first value represents a first voltage measured at the hardware interface, and the second value represents a product of an amount of the current, and an expected resistance of the resistor.

In one or more sixth embodiments, further to any of the first through third embodiments, the IC die further comprises an amplifier circuit which is coupled to receive the reference voltage.

In one or more seventh embodiments, further to the sixth embodiment, the IC die further comprises one or more other resistors which are coupled to the amplifier circuit, wherein the one or more other resistors each have a respective resistance which is substantially equal to the resistance of the resistor.

In one or more eighth embodiments, further to the sixth embodiment, the IC die further comprises fourth circuitry and one or more variable resistance circuits, wherein, for each of the one or more variable resistance circuits, the fourth circuitry is to set a respective resistance of the variable resistance circuit based on an output of the amplifier circuit.

In one or more ninth embodiments, further to the eighth embodiment, the one or more variable resistance circuits comprise a pull-up circuit or a pull-down circuit.

In one or more tenth embodiments, further to the eighth embodiment, the one or more variable resistance circuits comprise an on-die termination circuit.

In one or more eleventh embodiments, further to the eighth embodiment, based on the scale factor, the fourth circuitry is to set respective resistances of each of the one or more variable resistance circuits, wherein the fourth circuitry is to set a first resistance of a variable pull-down circuit, and set a second resistance of a variable pull-up circuit, wherein the second resistance is based on the first resistance.

In one or more twelfth embodiments, further to the sixth embodiment, an adaptive current bias circuit of the IC die comprises the amplifier circuit.

In one or more thirteenth embodiments, a test unit comprises a hardware interface to couple the test unit to an integrated circuit (IC) die, first circuitry to conduct a current with a resistor of the IC die via the hardware interface, and second circuitry to measure a voltage at the hardware interface, wherein the voltage is based on the current and a resistance of the resistor, third circuitry to perform an evaluation of the resistance based on the voltage, and fourth circuitry to provide to the IC die a signal which comprises an indication of a scale factor, wherein the indication is based on the evaluation, wherein the IC die is to generate a reference voltage based on the indication of the scale factor.

In one or more fourteenth embodiments, further to the thirteenth embodiment, within the IC die, the resistor is electrically decoupled from any active circuit element of the IC die.

In one or more fifteenth embodiments, further to the thirteenth embodiment or the fourteenth embodiment, the third circuitry is to calculate the scale factor based on the evaluation, wherein the fourth circuitry to provide the indication comprises the fourth circuitry to communicate to the IC die a value which specifies the scale factor.

In one or more sixteenth embodiments, further to the fifteenth embodiment, the third circuitry is to calculate the scale factor based on a ratio of a first value to a second value, wherein the first value represents a first voltage measured at the hardware interface, and the second value represents a product of an amount of the current, and an expected resistance of the resistor.

In one or more seventeenth embodiments, further to any of the thirteenth through fifteenth embodiments, the fourth circuitry to provide the indication comprises the fourth circuitry to communicate to the IC die a first value which specifies the resistance of the resistor, and wherein, based on the first value, the IC die is to calculate a second value which specifies the scale factor.

In one or more eighteenth embodiments, a system comprises an integrated circuit (IC) die comprising a hardware interface to couple the IC die to a test unit, a resistor coupled to the hardware interface, the resistor to conduct a current with the test unit when the hardware interface is coupled to the test unit, wherein, based on the current, the test unit is to perform an evaluation of a resistance of the resistor, first circuitry to receive a signal from the test unit via the hardware interface, wherein the signal is to comprise an indication of a scale factor, wherein the indication is based on the evaluation, and second circuitry to identify the scale factor based on the indication, and to generate a reference voltage based on the scale factor, and a display device coupled to the IC die, the display device to display an image based on the reference voltage.

In one or more nineteenth embodiments, further to the eighteenth embodiment, within the IC die, the resistor is electrically decoupled from any active circuit element of the IC die.

In one or more twentieth embodiments, further to the eighteenth embodiment or the nineteenth embodiment, the indication is to comprise a value which specifies the scale factor.

In one or more twenty-first embodiments, further to any of the eighteenth through twentieth embodiments, providing the indication comprises communicating to the IC die a first value which specifies the resistance of the resistor, and wherein, based on the first value, the IC die calculates a second value which specifies the scale factor.

In one or more twenty-second embodiments, further to the twenty-first embodiment, the scale factor is calculated based on a ratio of a first value to a second value, wherein the first value represents a first voltage measured at the hardware interface, and the second value represents a product of an amount of the current, and an expected resistance of the resistor.

In one or more twenty-third embodiments, further to any of the eighteenth through twentieth embodiments, the IC die further comprises an amplifier circuit which is coupled to receive the reference voltage.

In one or more twenty-fourth embodiments, further to the twenty-third embodiment, the IC die further comprises one or more other resistors which are coupled to the amplifier circuit, wherein the one or more other resistors each have a respective resistance which is substantially equal to the resistance of the resistor.

In one or more twenty-fifth embodiments, further to the twenty-third embodiment, the IC die further comprises fourth circuitry and one or more variable resistance circuits, wherein, for each of the one or more variable resistance circuits, the fourth circuitry is to set a respective resistance of the variable resistance circuit based on an output of the amplifier circuit.

In one or more twenty-sixth embodiments, further to the twenty-fifth embodiment, the one or more variable resistance circuits comprise a pull-up circuit or a pull-down circuit.

In one or more twenty-seventh embodiments, further to the twenty-fifth embodiment, the one or more variable resistance circuits comprise an on-die termination circuit.

In one or more twenty-eighth embodiments, further to the twenty-fifth embodiment, based on the scale factor, the fourth circuitry is to set respective resistances of each of the one or more variable resistance circuits, wherein the fourth circuitry is to set a first resistance of a variable pull-down circuit, and set a second resistance of a variable pull-up circuit, wherein the second resistance is based on the first resistance.

In one or more twenty-ninth embodiments, further to the twenty-third embodiment, an adaptive current bias circuit of the IC die comprises the amplifier circuit.

In one or more thirtieth embodiments, a method comprises conducting a current with a test unit and a resistor of an integrated circuit (IC) die which is coupled to the test unit via a hardware interface, and with the test unit measuring a voltage at the hardware interface, wherein the voltage is based on the current and a resistance of the resistor, based on the voltage, performing an evaluation of the resistance of the resistor, and providing to the IC die a signal which comprises an indication of a scale factor, wherein the indication is based on the evaluation, wherein the IC die generates a reference voltage based on the indication of the scale factor.

In one or more thirty-first embodiments, further to the thirtieth embodiment, within the IC die, the resistor is electrically decoupled from any active circuit element of the IC die.

In one or more thirty-second embodiments, further to the thirtieth embodiment or the thirty-first embodiment, the method further comprises calculating the scale factor at the test unit based on the evaluation, wherein providing the indication comprises communicating to the IC die a value which specifies the scale factor.

In one or more thirty-third embodiments, further to the thirty-second embodiment, the scale factor is calculated based on a ratio of a first value to a second value, wherein the first value represents a first voltage measured at the hardware interface, and the second value represents a product of an amount of the current, and an expected resistance of the resistor.

In one or more thirty-fourth embodiments, further to any of the thirtieth through thirty-second embodiments, providing the indication comprises communicating to the IC die a first value which specifies the resistance of the resistor, and wherein, based on the first value, the IC die calculates a second value which specifies the scale factor.

In one or more thirty-fifth embodiments, a method comprises conducting a current with a resistor of an IC die and a test unit which is coupled to the test unit via a hardware interface, wherein, based on the current, the test unit performs an evaluation of a resistance of the resistor, and calculates a scale factor based on the evaluation, receiving from the test unit a signal which comprises an indication of a scale factor, wherein the indication is based on the evaluation, identifying the scale factor based on the indication, and generating a reference voltage based on the scale factor.

In one or more thirty-sixth embodiments, further to the thirty-fifth embodiment, within the IC die, the resistor is electrically decoupled from any active circuit element of the IC die.

In one or more thirty-seventh embodiments, further to the thirty-fifth embodiment or the thirty-sixth embodiment, the indication comprises a value which specifies the scale factor.

In one or more thirty-eighth embodiments, further to any of the thirty-fifth through thirty-seventh embodiments, providing the indication comprises communicating to the IC die a first value which specifies the resistance of the resistor, and wherein, based on the first value, the IC die calculates a second value which specifies the scale factor.

In one or more thirty-ninth embodiments, further to the thirty-eighth embodiment, the scale factor is calculated based on a ratio of a first value to a second value, wherein the first value represents a first voltage measured at the hardware interface, and the second value represents a product of an amount of the current, and an expected resistance of the resistor.

In one or more fortieth embodiments, further to any of the thirty-fifth through thirty-seventh embodiments, an amplifier circuit of the IC die is coupled to receive the reference voltage.

In one or more forty-first embodiments, further to the fortieth embodiment, the amplifier circuit is further coupled to one or more other resistors of the IC die, wherein the one or more other resistors which each have a respective resistance which is substantially equal to the resistance of the resistor.

In one or more forty-second embodiments, further to the fortieth embodiment, the IC die further comprises one or more variable resistance circuits, and wherein, for each of the one or more variable resistance circuits, a respective resistance of the variable resistance circuit is to be set based on an output of the amplifier circuit.

In one or more forty-third embodiments, further to the forty-second embodiment, the one or more variable resistance circuits comprise a pull-up circuit or a pull-down circuit.

In one or more forty-fourth embodiments, further to the forty-second embodiment, the one or more variable resistance circuits comprise an on-die termination circuit.

In one or more forty-fifth embodiments, further to the forty-second embodiment, the method further comprises based on the scale factor, setting respective resistances of each of one or more variable resistance circuits of the IC die, wherein setting the respective resistances comprises setting a first resistance of a variable pull-down circuit, and setting a second resistance of a variable pull-up circuit, wherein the second resistance is based on the first resistance.

In one or more forty-sixth embodiments, further to the fortieth embodiment, an adaptive current bias circuit of the IC die comprises the amplifier circuit.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:
1. An integrated circuit (IC) die comprising:
a hardware interface comprising conductive contact structures by which the IC die is to be electrically coupled to a test unit, wherein the conductive contact structures are each at a periphery of the IC die, and are each to be brought into surface-to-surface contact with a different respective contact structure of another hardware interface of the test unit;
a first resistor coupled to the hardware interface, the first resistor to conduct a current with the test unit when the hardware interface is coupled to the test unit, wherein, based on the current, the test unit is to perform an evaluation of a resistance of the first resistor;
first circuitry to receive a signal from the test unit via the hardware interface, wherein the signal is to comprise an indication of a scale factor which is based on a ratio of a first value to a second value, wherein:
the first value represents a first voltage measured at the hardware interface;
the second value represents a product of an amount of the current and an expected resistance of the first resistor; and
the indication is based on the evaluation;
second circuitry to identify the scale factor based on the indication, and to generate a reference voltage based on the scale factor;
a second resistor; and
an amplifier circuit comprising:
a first input terminal coupled to the second circuitry;
a second input terminal coupled, via the second resistor, to a source of a second voltage; and
an output terminal to provide a third voltage based on the reference voltage and the second voltage.
2. The IC die of claim 1, wherein the indication is to comprise a value which specifies the scale factor.
3. The IC die of claim 1, wherein the test unit is to communicate the first value to the IC die, and wherein, based on the first value, the IC die is to calculate the scale factor.
4. The IC die of claim 1, further comprising one or more other resistors which are coupled to the amplifier circuit, wherein the one or more other resistors each have a respective resistance which is substantially equal to the resistance of the first resistor.
5. The IC die of claim 1, further comprising fourth circuitry and one or more variable resistance circuits, wherein, for each of the one or more variable resistance circuits, the fourth circuitry is to set a respective resistance of the variable resistance circuit based on an output of the amplifier circuit.
6. The IC die of claim 5, wherein the one or more variable resistance circuits comprise a pull-up circuit or a pull-down circuit.
7. The IC die of claim 5, wherein the one or more variable resistance circuits comprise an on-die termination circuit.
8. The IC die of claim 5, wherein, based on the scale factor, the fourth circuitry is to set respective resistances of each of the one or more variable resistance circuits, wherein the fourth circuitry is to:
set a first resistance of a variable pull-down circuit; and
set a second resistance of a variable pull-up circuit, wherein the second resistance is based on the first resistance.
9. The IC die of claim 1, wherein an adaptive current bias circuit of the IC die comprises the amplifier circuit.

10. A test unit comprising:
a hardware interface comprising conductive contact structures by which the test unit is to be electrically coupled to an integrated circuit (IC) die, wherein the conductive contact structures are each at a periphery of the test unit, and are each to be brought into surface-to-surface contact with a different respective contact structure of another hardware interface of the IC die;
first circuitry to conduct a current with a resistor of the IC die via the hardware interface;
second circuitry to measure a voltage at the hardware interface, wherein the voltage is based on the current and a resistance of the resistor;
third circuitry to perform an evaluation of the resistance based on the voltage; and
fourth circuitry to provide to the IC die a signal which comprises an indication of a scale factor, wherein the indication is based on the evaluation;
wherein the IC die is to generate a reference voltage based on the indication of the scale factor.
11. The test unit of claim 10, wherein, within the IC die, the resistor is electrically decoupled from any active circuit element of the IC die.
12. The test unit of claim 10, wherein the third circuitry is to calculate the scale factor based on the evaluation, wherein the fourth circuitry to provide the indication comprises the fourth circuitry to communicate to the IC die a value which specifies the scale factor.
13. The test unit of claim 12, wherein the third circuitry is to calculate the scale factor based on a ratio of a first value to a second value, wherein:
the first value represents a first voltage measured at the hardware interface; and
the second value represents a product of an amount of the current, and an expected resistance of the resistor.
14. The test unit of claim 10, wherein the fourth circuitry to provide the indication comprises the fourth circuitry to communicate to the IC die a first value which specifies the resistance of the resistor, and wherein, based on the first value, the IC die is to calculate a second value which specifies the scale factor.
15. A system comprising:
an integrated circuit (IC) die comprising:
a hardware interface comprising conductive contact structures by which the IC die is to be electrically coupled to a test unit, wherein the conductive contact structures are each at a periphery of the IC die, and are each to be brought into surface-to-surface contact with a different respective contact structure of another hardware interface of the test unit;
a first resistor coupled to the hardware interface, the first resistor to conduct a current with the test unit when the hardware interface is coupled to the test unit, wherein, in based on the current, the test unit is to perform an evaluation of a resistance of the first resistor;
first circuitry to receive a signal from the test unit via the hardware interface, wherein the signal is to comprise an indication of a scale factor which is based on a ratio of a first value to a second value, wherein:
the first value represents a first voltage measured at the hardware interface;
the second value represents a product of an amount of the current and an expected resistance of the first resistor; and
the indication is based on the evaluation;

second circuitry to identify the scale factor based on the indication, and to generate a reference voltage based on the scale factor;
a second resistor; and
an amplifier circuit comprising:
 a first input terminal coupled to the second circuitry;
 a second input terminal coupled, via the second resistor, to a source of a second voltage; and
 an output terminal to provide a third voltage based on the reference voltage and the second voltage; and
a display device coupled to the IC die, the display device to display an image based on the reference voltage.

16. The system of claim 15, the IC die further comprising fourth circuitry and one or more variable resistance circuits, wherein, for each of the one or more variable resistance circuits, the fourth circuitry is to set a respective resistance of the variable resistance circuit based on an output of the amplifier circuit.

17. The system of claim 15, wherein an adaptive current bias circuit of the IC die comprises the amplifier circuit.

* * * * *